(12) United States Patent
Schwartz

(10) Patent No.: US 6,351,162 B1
(45) Date of Patent: Feb. 26, 2002

(54) CIRCUIT ARRANGEMENT FOR CONTROLLING AN INDUCTIVE LOAD

(75) Inventor: Reiner Schwartz, Grafing (DE)

(73) Assignee: STMicroelectronics GmbH, Grasbrunn (DE)

( * ) Notice: Subject to any disclaimer, the term of this patent is extended or adjusted under 35 U.S.C. 154(b) by 0 days.

(21) Appl. No.: 09/563,780

(22) Filed: May 2, 2000

(30) Foreign Application Priority Data

May 3, 1999 (DE) .......................................... 199 20 306

(51) Int. Cl.$^7$ ............................................. H02M 3/335
(52) U.S. Cl. ...................... 327/110; 327/531; 363/21.1; 363/21.12
(58) Field of Search ................................ 327/108, 110, 327/101, 172, 176, 531; 363/21.05, 21.1, 21.12

(56) References Cited

U.S. PATENT DOCUMENTS

| | | | |
|---|---|---|---|
| 3,970,919 A | | 7/1976 | Butcher ........................ 323/19 |
| 4,109,194 A | | 8/1978 | Miller .......................... 323/17 |
| 4,132,925 A | | 1/1979 | Schmutzer et al. .......... 315/208 |
| 4,414,479 A | * | 11/1983 | Foley ........................... 327/483 |
| 4,446,410 A | | 5/1984 | Yagura et al. ................ 318/687 |
| 4,511,829 A | | 4/1985 | Wisniewski ................... 318/317 |
| 4,890,210 A | * | 12/1989 | Myers ........................... 363/21 |
| 4,967,309 A | | 10/1990 | Hoffman ....................... 361/160 |
| 5,416,361 A | * | 5/1995 | John et al. .................... 327/310 |
| 5,477,175 A | * | 12/1995 | Tisinger et al. ............... 327/143 |
| 5,610,502 A | * | 3/1997 | Tallant, II et al. ........... 323/222 |
| 5,734,564 A | * | 3/1998 | Brkovic ........................ 363/21 |
| 5,796,218 A | * | 8/1998 | Kwon et al. ................. 315/411 |
| 5,798,635 A | * | 8/1998 | Hwang et al. ............... 323/222 |
| 5,801,458 A | | 9/1998 | Marks ........................ 307/131 |
| 5,917,712 A | * | 6/1999 | Okura et al. .................. 363/19 |
| 6,007,210 A | * | 12/1999 | Yamamoto et al. ........... 362/61 |

FOREIGN PATENT DOCUMENTS

| | | |
|---|---|---|
| DE | 44 34 179 A1 | 3/1996 |
| DE | 197 43 346 A1 | 4/1999 |
| GB | 2 081 942 A | 2/1982 |

\* cited by examiner

Primary Examiner—Terry D. Cunningham
(74) Attorney, Agent, or Firm—Lisa Jorgenson; E. Russell Tarleton; Seed Ip Law Group PLLC (57) ABSTRACT

An inductive load is controlled using a PWM control signal at the control terminal of a current switch. In parallel to the first circuit branch containing the inductive load to be controlled, there is located a second circuit branch including a flyback diode and a measuring resistor. The actual current signal corresponding to the current in the inductive load to be regulated, which is formed using the current in the measuring resistor as measurement voltage, is compared to a desired current signal, and the result of the comparison is processed by a PWM circuit to form a PWM control signal for current switch. Due to the fact that measuring resistor is disposed in the circuit parallel to the inductive load to be controlled, a favorable behavior of the power dissipation in the measuring resistor is obtained in accordance with the duty cycle of the PWM control signal. With a preset value of the measuring resistor, the power dissipation and the required chip area can thus be reduced. With preset maximum power dissipation, the measuring accuracy in the lower measuring range can be enhanced.

13 Claims, 7 Drawing Sheets

CIRCUIT ARRANGEMENT FOR CONTROLLING AN INDUCTIVE LOAD

TECHNICAL FIELD

The invention relates to a circuit arrangement for controlling an inductive load.

BACKGROUND OF THE INVENTION

A specific field of application of the invention is the control of an inductive load in the form of an electromagnetic driver device for a brake valve of an anti-locking brake system (ABS). The disclosed embodiments of the invention are concerned specifically with the closed-loop control of an inductive load with the aid of a PWM adjusting or control signal, i.e., a control signal in the form of a pulse train with variable pulse duty factor or duty cycle (DC=ratio of pulse duration to pulse interval). The PWM control signal (PWM= Pulse Width Modulation) opens and blocks an electronic current switching element provided in the circuit of the inductive load.

The inductive load to be controlled, which is located in a first circuit branch, usually has a second circuit branch connected in parallel thereto which contains a flyback diode. The electronic current switching element is provided in a third circuit branch in series connection "upstream" or "downstream" of the first and second terminals of the first and second circuit branches. When the electronic current switching element opens and closes in alternating manner, current is flowing through the inductive load when the current switching element is opened, whereas with closed current switching element there is a reverse current flow through the flyback diode due to the energy stored in the inductive load.

If it is desired to control, for example, a fluid pressure by means of the inductive load (for example an electromagnet), this is effected by controlling the current flow through the inductive load. To this end, the current flow through the inductive load is measured in order to obtain an actual current signal, and this actual current signal is compared to a target or desired current signal corresponding to the current desired in order to provide a PWM control signal for controlling the current switching element on the basis of the comparison result.

The determination of the current flow through the inductive load usually takes place with the aid of a measuring resistor connected directly in series with the inductive load or arranged in series with the electronic current switching element. The measuring resistor delivers a measurement voltage. This measurement voltage is compared to a reference voltage corresponding to the desired current signal. The reference voltage is delivered by a reference resistor connected in series with a variable current source. By means of the variable current source, it is possible to provide the desired current signal at the reference resistor, with the reference voltage then corresponding to the desired current intensity through the inductive load.

Circuit arrangements of the type concerned here are usually in the form of integrated circuits. The inductive load to be controlled is connected to a battery voltage terminal and an output voltage terminal. Apart from the inductive load to be controlled proper, all or almost all circuit elements are provided within the integrated circuit.

In such a circuit arrangement, there arises considerable power dissipation, depending on the duty cycle (DC) of the PWM control signal. In case of high duty cycle and correspondingly strong current flow, there is high power dissipation created, which needs to be dissipated with the aid of a correspondingly large chip area. As is known, the power dissipation is proportional to the resistance and moreover proportional to the square of the current. However, current control is indispensable due to the high temperature dependency of the ohmic resistance component of the inductive load. This holds for most, if not all, applications of the type concerned here.

The dependency of the power dissipation in the measuring resistor on the duty cycle of the PWM setting signal corresponds to a monotonously increasing curve. Usable in practical application is the range between 10% and 90%. In order to obtain relatively high accuracy in particular in the lower measuring range, it is necessary to use a high resistance value for the measuring resistor. The measurement accuracy in the lower range is of particular significance in most applications. With an about linear increase of the power dissipation as a function of the duty cycle, however, the measurement accuracy is relatively low in the lower measuring range, whereas considerable power dissipation arises in the upper measuring range.

SUMMARY OF THE INVENTION

The disclosed embodiments of the present invention make available a circuit arrangement for controlling an inductive load, which, with a preset value of the measuring resistor, has lower power dissipation in the measuring resistor in comparison with that of the prior art, and which, with preset power dissipation, can make do with comparatively little chip area. With preset maximum power dissipation, an increase in the value of the measurement resistor is possible in order to thus obtain higher measurement accuracy in the lower measuring range.

To this end, the embodiments of the invention provide a circuit arrangement for controlling an inductive load, including:

a) a first circuit branch located between a first terminal and a second terminal and including the inductive load to be controlled;

b) a second circuit branch located between the first terminal and the second terminal and including a flyback diode;

c) a third circuit branch located between the first and second circuit branches on the one hand and a third terminal on the other hand and including an electronic current switching element having a control terminal to which a PWM control signal is supplied;

d) a current sensor for sensing a current dependent on the current flowing through the inductive load, and for generating an actual current signal; and e) a closed-loop control circuit receiving as first input signal the actual current signal and as second input signal a desired current signal in order to form thereof the PWM control signal;

f) the current sensor being arranged in the second circuit branch.

The current sensor preferably is an ohmic measuring resistor connected in series with the flyback diode in the second circuit branch. The desired current signal preferably is formed in a fourth circuit branch connected to the second circuit branch and containing a reference resistor and in particular a variable current source. The current determined by the current source generates at the reference resistor a reference voltage representing the desired current signal.

This desired current signal is compared to the actual current signal in the form of the measurement voltage created at the measuring resistor, in order to obtain a deviation signal that in a preferred embodiment of the invention is created as a sign signal. This sign signal then is processed further in order to obtain the PWM control signal.

With an ohmic measuring resistor, the measurement voltage changes proportionally with the current intensity. The measurement results obtained are relatively exact.

In one specific embodiment of the invention, the current sensor is constituted by a component having non-linear characteristics, for example diode. In accordance with the diode characteristics, the reference element in the fourth circuit branch then is an element having characteristics corresponding to the current sensor, and thus in particular a reference diode in the instant case. The measuring diode and the reference diode are provided with substantially identical characteristics. Due to the fact that identical characteristics are not easy to obtain, this embodiment is suitable in particular for such applications in which a relatively high tolerance is permissible. As a measuring diode, the flyback diode proper can be employed as well.

Figure 5:
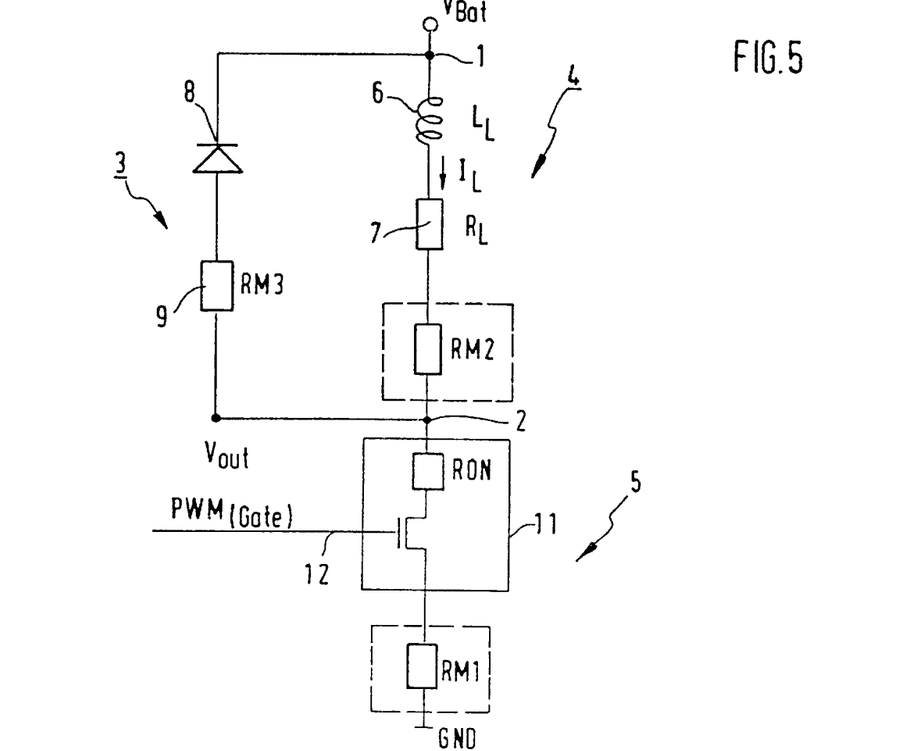
FIG. 5 is a block diagram illustrating the basic principle of the circuit arrangement according to the invention.
Figure 6:
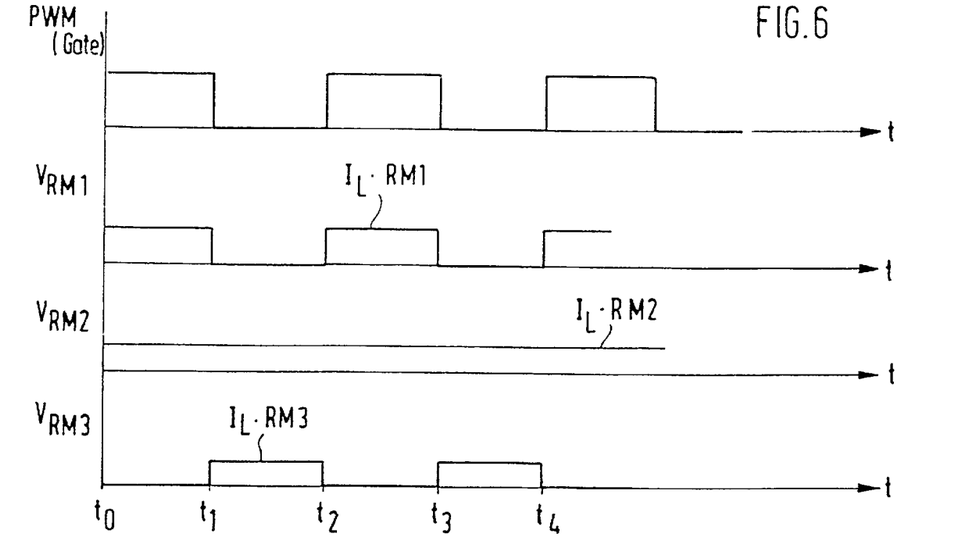
FIG. 6 is a pulse diagram elucidating the operation of the circuit according to FIG. 5.
Figure 8:
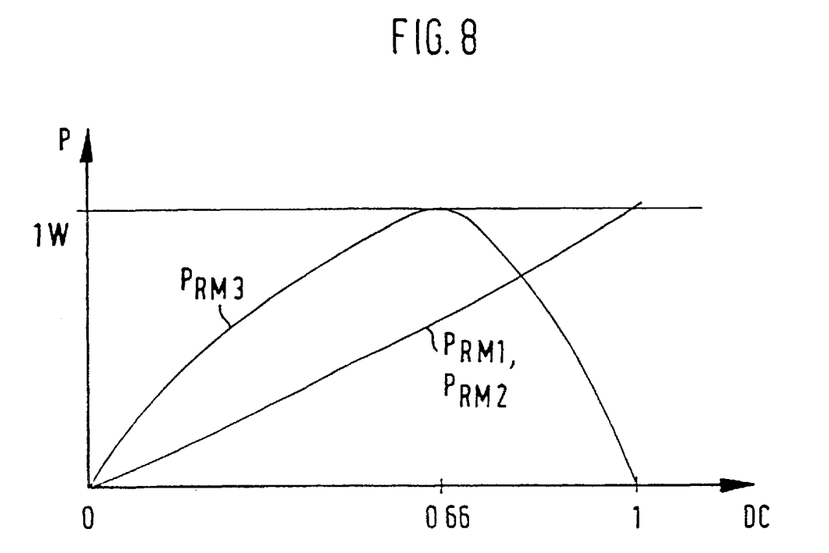
FIG. 8 is a graphic representation of the power dissipation in a measuring resistor as a function of the duty cycle DC of the PWM control signal for the circuit according to FIG. 5.
Figure 9:
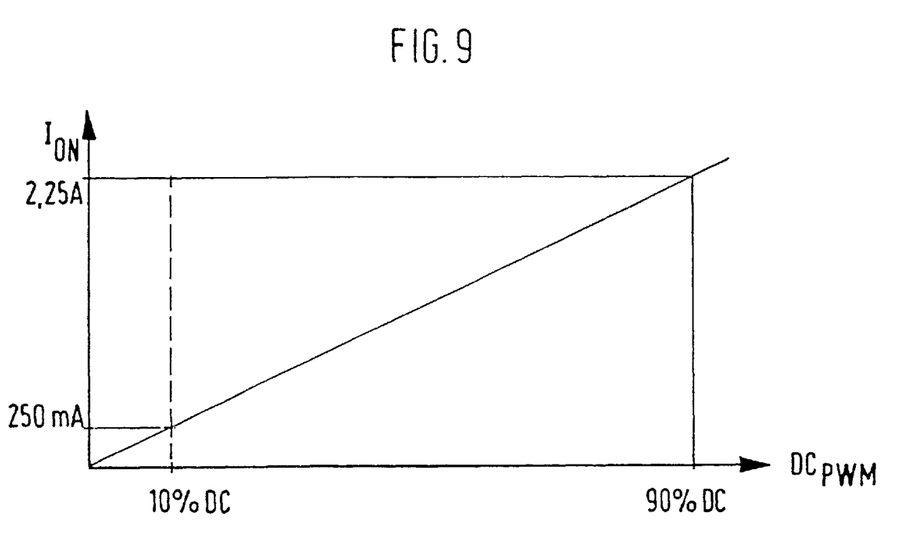
FIG. 9 illustrates the dependency of the current of the circuit according to FIG. 5 in accordance with the duty cycle of the PWM control signal.

Before describing specific embodiments of the invention, the differences between the invention on the one hand and the prior art on the other hand are to be elucidated, by way of FIGS. 5, 6 and 8, on the basis of the significance of the measure to arrange the current sensor in the second circuit branch, i.e., in the parallel branch of the inductive load to be controlled.

According to FIG. 5, a first circuit branch 4 is located between a first terminal 1 coupled with battery voltage $V_{Bat}$ and a second terminal 2 having a voltage $V_{out}$ applied thereto, said circuit branch 4 having an inductive load to be controlled, which in the instant case consists of an inductance 6 having an ohmic resistance component 7 associated therewith.

Connected to second terminal 2 is a third circuit branch 5. Third circuit branch 5 contains an electronic switching element 11, which in the instant case is in the form of a MOSFET, for example. The source-drain path is either conducting or blocking the current flow through third circuit branch 5, depending on a PWM control signal PWM (Gate) that is supplied to a control terminal 12 of current switching element 11. In the opened, i.e., activated state of current switching element 11, a closing resistor Ron is active in series within third circuit branch 5. Voltage $V_{out}$ at second terminal 2 changes suddenly in accordance with the PWM signal. When current switching element 11 is opened, $V_{out}$ corresponds approximately to the voltage at third terminal GND. When current switching element 11 is blocked, voltage $V_{out}$ at terminal 2 is higher than battery voltage $V_{Bat}$, as will still be elucidated in more detail hereinbelow.

FIG. 6, in the uppermost line, shows the PWM control signal PWM (Gate). Shown in broken lines at the bottom of FIG. 5 is a measuring resistor RM1 which is disposed between current switching element 11 and third terminal GND, as known from the prior art. The second line in FIG. 6 shows the path of measurement voltage $V_{RM1}$, at measuring resistance RM1 as a function of the PWM signal. If the PWM signal is of high level (e.g., 5V), electronic current switch 11 is conducting, and voltage $V_{RM1}$ arises at measuring resistor RM1 due to the current flow. The power then is $I_L^2 *RM1$. As averaged over the period duration, the power is dependent on the duty cycle (DC).

FIG. 5 shows an alternative to the arrangement of the measuring resistor. Between second terminal 2 and resistor 7, there is disposed a measuring resistor RM2 shown in a broken-line box to point out that—just as with the measuring resistor RM1—it is not really contained in the circuit but just constitutes a possibility corresponding to the prior art. In measuring resistor RM2, there is a current flowing when current switch 11 is opened and there is a current flowing when current switch 11 is closed. The latter reverse current when current switch 11 is blocked flows from inductance 6 through resistor 7 and measuring resistor RM1 to a second circuit branch 3 connected in parallel to first circuit branch 4. Second circuit branch 3 contains a flyback diode 8. The current flow through measuring resistor RM2 results in a voltage $V_{RM2}$ shown in the third line of FIG. 6. The corresponding power is $I_L^2 *RM2$.

Measuring resistor RM3, bearing reference numeral 9 in second switching branch 3, corresponds to the present invention. A measurement voltage $V_{RM3}$ arises at measuring resistor RM3 when current switching element 11 is blocked, as is gatherable from a comparison of the first and last lines in FIG. 6. The power dissipation in measuring resistor RM3 is $I_L^2 *RM3$.

In the following, the power dissipation in the measuring resistor RM3 arranged according to the invention, on the one hand, and in the two alternative measuring resistors RM2 and RM3 according to the prior art, on the other hand, shall be examined in more detail.

The maximum power dissipation in measuring resistor RM1 is $$P_{MAX}=I_L^2 *RM1*DC \qquad (1)$$

The maximum power dissipation in second measuring resistor RM2 is $$P_{MAX}=I_L^2 *RM2 \qquad (2)$$

The power dissipation in measuring resistor RM3 arranged according to the invention is $$P_{RM3}=I^2 *RM3(1-DC) \qquad (3)$$

The current $I_L$ fluctuating near the desired value in accordance with the control operation is as follows in the first and second circuit branches 4 and 3, respectively:

$$I_L = \frac{V_{Bat}}{R_L + R_{ON}} *DC \qquad (4)$$

By inserting equation (4) into equation (3), one obtains $$P_{RM3} = \left(\frac{V_{Bat}}{R_L + R_{ON}}\right)^2 *DC^2 *RM3 \ (1-DC) \qquad (5a)$$

$$= \frac{V_{Bat}^{*RM3}}{(R_L+R_{ON})^2} (DC^2 - DC^3) \qquad (5b)$$

The curve of power PRM3 as a function of the duty cycle DC is shown in FIG. 8. When the above equation (5b) is differentiated on the basis of DC, the result is $$\frac{dP_{RM3}}{d_{DC}} = \frac{V_{Bat}^2 + RM^3}{(R_L+R_{ON})^2}(2DC-3DC^2) \qquad (6)$$

Obtained from $$2DC-3DC^2=0 \qquad (7)$$

is, in addition to the trivial solution $$DC_1=0 \qquad (8)$$

the value $$DC_2=\tfrac{2}{3}=66\% \qquad (9)$$

In addition to the curve pattern for $P_{RM3}$ as a function of DC, FIG. 8 shows in addition the approximately linear path of $P_{RM1}$ and $P_{RM2}$. It can be seen that the maximum power dissipation for measuring resistors RM1 and RM2 is obtained only with the maximum duty cycle DC, whereas with the aid of the measuring resistor RM3 arranged according to the invention it is already obtained at a DC value of 0.66 or 66%.

From FIG. 8 and the statements made hereinbefore, the following can be derived: when considering the lower measuring range, in the instant case below DC values of approx. 0.6, a considerably steeper increase of the curve for $P_{RM3}$ results there as compared to the linear path for $P_{RM1}$ or $P_{RM2}$. With a preset maximum power dissipation (for example 1 W), one thus obtains by the measure according to the embodiments of the invention a considerably higher measuring accuracy in the lower, important measuring range.

With a preset resistance value for the measuring resistor, it would be possible to employ a lower resistance value, achieving comparable sensitivity. The parabola-like curve for $PRM_3$, in the lower range of the DC values, would extend approximately parallel to the straight line for RM1 and RM2, but would already reach its maximum value below the maximum value shown in FIG. 8.

A lower value for the resistance of RM3 thus means less power dissipation and correspondingly less chip area.

The invention can be implemented in a series of different embodiments, with these embodiments in part also containing new elements, independently of the measure of arranging the measuring resistor in the parallel circuit of the inductive load, as explained in detail hereinbefore. An essential component of the circuit arrangement for controlling an inductive load is the formation of the deviation signal from the actual current signal and the desired current signal in conjunction with the generation of the PWM control signal. In one embodiment, the invention provides for an RS flipflop having the sign signal supplied to the setting input thereof and a clock signal supplied to the resetting input thereof and having its output connected to the control terminal of the current switching element. The sign signal is formed by comparison of the reference voltage formed by the current source signal at the reference resistor with the measuring voltage arising at the measuring resistor. In the embodiment according to the invention, the RS flipflop is fed on the one hand with the sign signal for setting the flipflop and on the other hand with the clock signal for resetting the flipflop. The clock signal has a certain frequency which predetermines the switching frequency for the current switching element. The on-period of the current switching element, i.e., the duty cycle, is dependent on the sign signal, i.e., on the ratio of the actual current signal to the desired current signal. If the actual current is too weak, the current switching element has to be opened longer for increasing the current. Too little current leads to a correspondingly low measuring voltage at the comparator, so that the sign signal at the setting input of the RS flipflop appears at a relatively early time and thus increases the duty cycle. The effect achieved by way of such a circuit is that the current flowing through the inductive load is controlled to a minimum value. Upon reaching of the minimum value in accordance with the current delivered from the current source, switching over of the PWM control signal takes place to open the current switching element.

Considerably faster and exacter control can be achieved by another embodiment of the invention. This other embodiment of the invention provides:

a) an up/down counter having an up/down control input to which the sign signal is supplied, and a clock input to which a clock signal of a first frequency is supplied, as well as a count output;

b) a ramp counter having a clock input to which a clock signal of a second frequency is supplied, and a count output; and c) a digital comparator having a first input connected to the count output of the up/down counter, a second input connected to the count output of the ramp counter, and an output connected to the control terminal of the current switching element.

Up/down counter counts on the basis of the clock frequencies, with the contents thereof changing in upward and downward directions in accordance with the sign signal supplied thereto. Ramp counter counts relatively fast from a minimum value (for example 0) to a maximum value, with the count thereof corresponding to a ramp signal, in order to be reset again to the minimum value after reaching the maximum value and to start the counting operation anew. In connection with the comparator, the result obtained is similar to that obtained by a comparison of a slowly changing voltage or a direct current voltage with a sawtooth signal: at the output of the comparator, either a signal of high level or a signal of low level is created, depending on the sign situation. This signal is the PWM control signal supplied to the control terminal of the current switching element.

The clock signal for the ramp counter, i.e., the clock signal with the second frequency, may be a rigid system clock.

A preferred embodiment of the invention does not employ a clock signal of constant, first frequency for controlling the up/down counter, but a clock signal of variable frequency. This variable first frequency for the up/down counter becomes higher as the deviation between desired current signal and actual current signal increases. With strong control deviation, a specific embodiment of the invention makes use of a voltage-controlled oscillator which delivers a frequency-variable signal, with the voltage-controlled oscillator to this end receiving at the two input terminals thereof the actual current signal and the desired current signal, respectively, and having its output connected to the clock input of the up/down counter. In the case of strong control deviation, the voltage-controlled oscillator (VCO) delivers a clock signal of relatively high frequency, so that the up/down counter counts relatively fast in order to then count with a relatively low-frequency clock signal when desired current signal and actual current signal approach each other. By way of this measure, particularly rapid and nevertheless exact control of the current intensity in the inductive load is achieved without strong overshooting being caused.

For synchronizing the counting operation in the up/down counter with opening and closing of the current switching element, a preferred embodiment of the invention has a gate connected upstream of the clock input of up/down counter, with said gate being opened by the negated PWM control signal.

The above-described embodiment of the circuit arrangement according to the invention, comprising an up/down counter in conjunction with a ramp counter, can be refined still further for improving the control behavior, by:

a) a first up/down counter part referred to as I or integral counter;

b) a second up/down counter part referred to as P or proportional counter;

c) a PWM register having an input and an output; and d) an adder having two inputs connected to the output of the I counter part and to the output of the P counter part, respectively, and an output connected to the input of the PWM register, e) the output of the PWM register being connected to the input of the digital comparator, the clock input of the P counter part being fed with the clock signal of the first frequency, the clock input of the I counter part being fed with a clock signal of a third frequency that is preferably lower than the first frequency, and the P counter part having a resetting input connected to the ramp counter and receiving from the same a resetting signal in each ramp period.

Preferably, the clock signal of the I counter part is formed from the clock signal of the P counter part by frequency division. By splitting the up/down counter into an I counter part, clocked relatively slowly, and a P counter part, clocked relatively rapidly, a PI control behavior is obtained. The P portion provides for rapid approximation of the actual current to the desired current, while the I counter part provides for smoothing of the control behavior.

Depending on processing of the deviation signal obtained by comparison of the desired current signal and actual current signal, there is on the one hand the possibility of providing only one constant measuring time within each period duration of the PWM control signal. On the other hand, the measuring time can cover the entire time duration within which current flows through the measuring resistor. Such a measuring time then corresponds in essence to the pulse interval of the PWM control signal. However, the measuring time thus is dependent on the particular duty cycle DC of the PWM control signal. If the measuring time is short, only relatively few pulses are counted within such a short measuring time when a clocked counter is employed, whereas correspondingly more pulses will be counted with a longer measuring time. For avoiding measuring errors in this respect, a specific further development of the invention provides for measuring time compensation. The measuring time compensation is made using a measuring time compensation circuit which scales down the clock signal of the first frequency, that is supplied to the clock input of the up/down counter, as a function of the duty cycle of the PWM control signal in such a manner that, with high duty cycle and thus long measuring time, relatively strong scaling down takes place, whereas with low duty cycle only relatively weak scaling down takes place. Accordingly, counting with a relatively slow clock takes place with a long measuring time, while counting with a correspondingly faster clock takes place in the case of a relatively short measuring time. The effect achievable by corresponding selection of the scaling down ratio for longer measuring times is that counting operations independent of the measuring time take place. In a preferred embodiment of the invention, the measuring time compensation circuit comprises:

a) a resettable counter having an input receiving an input clock signal with an input frequency, and having a counter output and a resetting input;

b) a divisor register having an output and a setting input via which a digital value in the divisor register is adjustable that is in inverse ratio to the duty cycle of the PWM control signal, and c) a divider circuit having a dividend input connected to the output of the counter, a divisor input connected to the output of the divisor register, and an output passing the clock signal of the first frequency to the clock input of the up/down counter.

This structure of the measuring time compensation circuit is comparatively simple and delivers the correct amounts of counting pulses to the up/down counter, irrespective of the measuring time and the duty cycle of the PWM control signal, respectively.

BRIEF DESCRIPTION OF THE DRAWINGS

In the following, the embodiments of the invention shall be elucidated in more detail by way of the drawings in which.

DETAILED DESCRIPTION OF THE INVENTION

Figure 1:
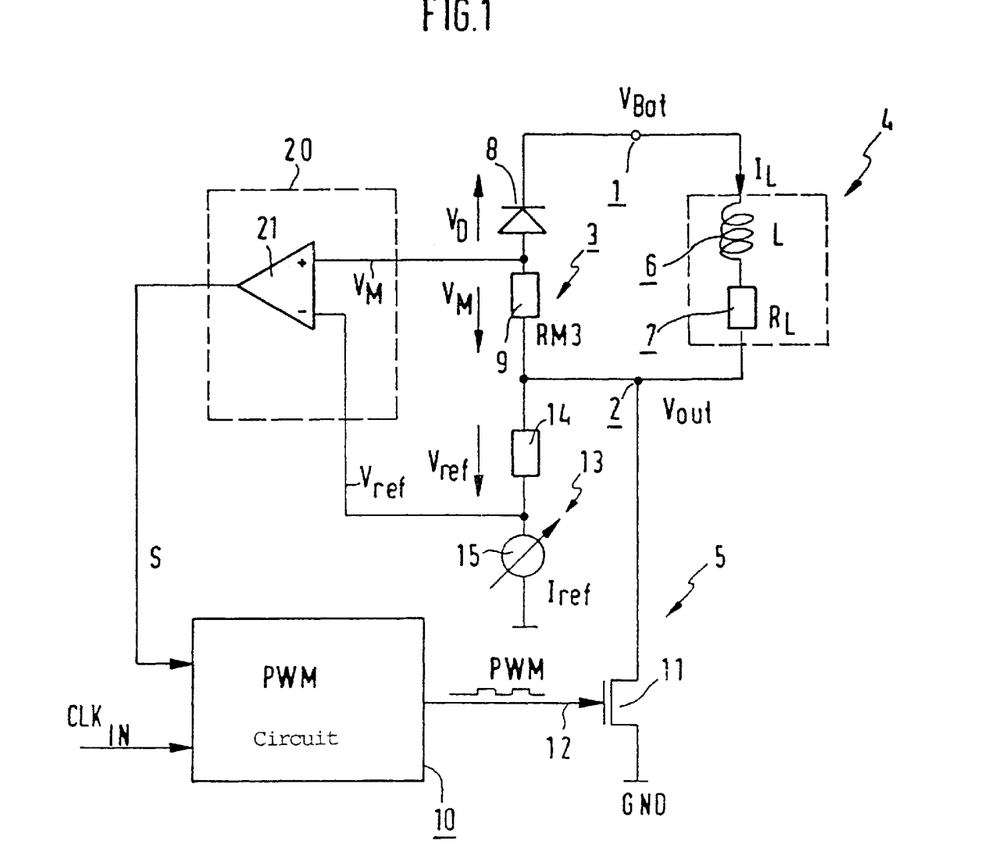
FIG. 1 is a circuit sketch of a circuit arrangement for controlling an inductive load according to a first embodiment of the invention.

The basic principle of the circuit arrangement for controlling an inductive load, according to one embodiment of the invention, elucidated hereinbefore in connection with FIGS. 5, 6 and 8. The circuit elements shown in FIG. 5 are also part of the circuit arrangement shown in FIG. 1, illustrating a first basic embodiment of the invention. The components already explained in connection with FIG. 5 shall not be elucidated again. The circuit shown in the right-hand part in FIG. 1 is approximately similar to the circuit according to FIG. 5 and contains a first circuit branch 4 including an inductive load 6 to be controlled and an associated ohmic resistor 7, a second circuit branch 3 including a flyback diode 8 and a third circuit branch 5 including an electronic switching element 11. Switching element 11 in the instant case is, for example, a MOSFET with a control terminal 12.

Circuit branches 4 and 3 are arranged parallel to each other between a first terminal 1 ($V_{BAT}$) and a second terminal 2 ($V_{out}$), and the third circuit branch 5 is located between second terminal 2 and a third terminal GND (ground).

For controlling the current in the inductive load containing the inductance 6 with a value L and an ohmic resistance component with a value $R_L$, the current flow through the load is activated and deactivated at control terminal 12 of current switch 11 in accordance with a PWM control signal. Upon deactivation of current switch 11, the current flow through the third circuit branch 5 is blocked. Due to the energy stored in the inductance, current $I_L$ now flows through second circuit branch 3 since, and as long as, the circuit at second terminal 2, i.e., $V_{out}$, has a higher value than voltage $V_{Bat}$ (the forward voltage of flyback diode 8 is not considered here). The flyback current through the then open flyback diode 8 also flows through measuring resistor 9 or RM3 and leads to a measurement voltage $V_M$.

Connected to second terminal 2 is a fourth circuit branch 13 containing a variable current source 15 and a reference resistor 14. Current source 15 delivers an adjustable reference current Iref resulting in a voltage Vref at reference resistor 14. The measurement voltage $V_M$ and the reference voltage Vref are fed to a comparator 20 which in the instant case contains an operational amplifier 21, with the measurement voltage $V_M$ being fed to the non-inverting input whereas the reference voltage Vref is fed to the inverting input.

The output signal S of the comparator is a sign signal of either high or low level. The level indicates whether signal $V_M$ is greater than Vref, or vice versa. Sign signal S is supplied to a PWM circuit 10 which in addition receives an input clock signal $CLK_{IN}$. The clock signal $CLK_{IN}$ determines the period duration of the PWM control signal at the output of PWM circuit 10, which is supplied to control terminal 12 of current switch 11.

Figure 2:
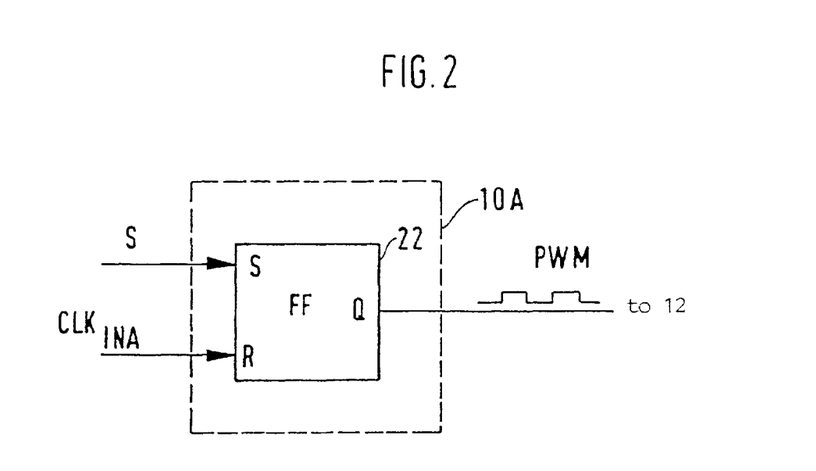
FIG. 2 is a block diagram of a first version of the first embodiment of the invention.

FIG. 2 shows a first specific version of the embodiment of the circuit arrangement according to the invention shown in FIG. 1. According to FIG. 2, PWM circuit 10A is designed as RS flipflop 22 having a setting input S, a resetting input R and an output Q.

The mode of operation of the circuit according to FIGS. 1 and 2 shall be elucidated in the following in conjunction with the pulse diagram shown in FIG. 3.

Figure 3:
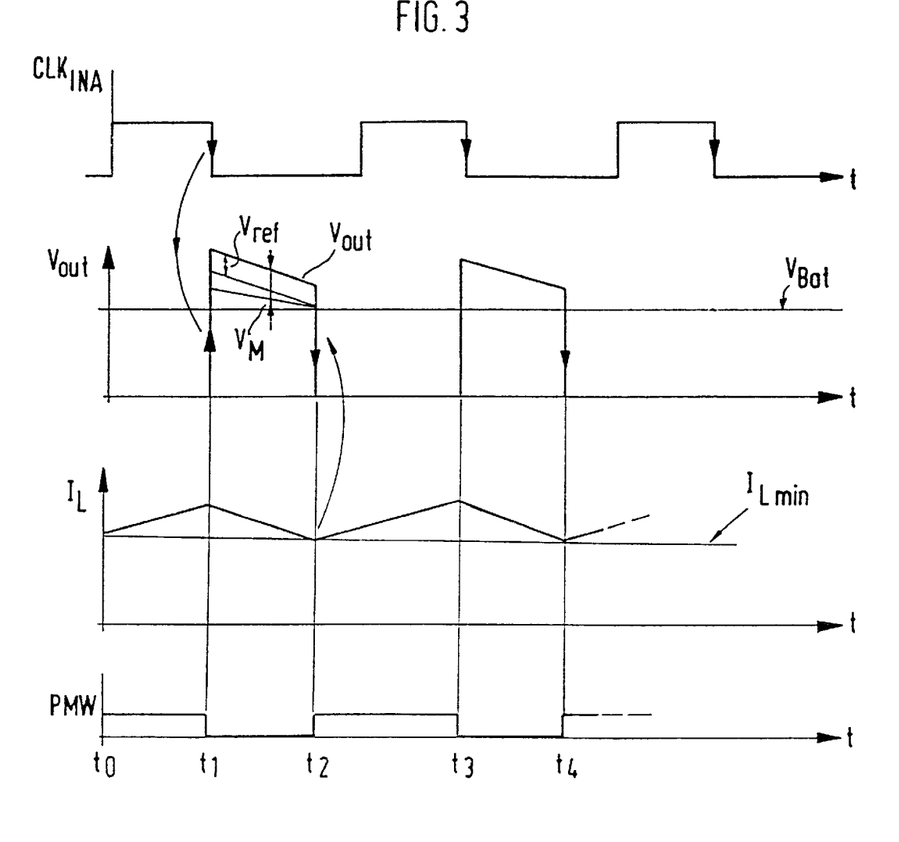
FIG. 3 is a pulse diagram illustrating the operation of the embodiment according to FIGS. 1 and 2.

The clock signal $CLK_{IN}$ is shown in the uppermost line in FIG. 3. The signal has a fixed period duration which determines the period duration of the PWM control signal at terminal 12 of current switch 11. At each trailing edge of clock signal $CLK_{INA}$, RS flipflop 22 is reset so that the output Q thereof has a low level. By way of this low level of the PWM control signal at control terminal 12, current switching element 11 is blocked. According to the second line in FIG. 3, the voltage Vout suddenly increases from a value of zero to a value above voltage $V_{Bat}$. This happens at the moment of time t1 (cp. the lowermost line in FIG. 3, illustrating the PWM control signal). Voltage Vout at the time t1 is composed of voltage $V_{Bat}$ plus the measurement voltage $V_M$. Moreover, the second line in FIG. 3 illustrates the constant reference voltage Vref.

While current switching element 11 is blocked and current $I_L$ flows through the second circuit branch 3, this current $I_L$ and thus the measurement voltage $V_M$ decrease gradually. When the value of the measurement voltage $V_M$ reaches the value of reference voltage Vref, which happens at the time t2 according to FIG. 3, the sign conditions at the two inputs of comparator 20 change so that as a consequence thereof the level of the sign signal S appearing at the output of the comparator changes. Due to this level change of the signal at the input S of RS flipflop 22, said flipflop is switched over so that a high level of the PWM control signal is formed at output Q, whereby current switching element 11 is opened. This causes an instantaneous decrease of the voltage Vout at second terminal 2 to zero (strictly speaking to approx. zero, considering the closing resistance Ron of current switching element 11).

While the current switching element is opened, current is flowing through first current branch 4, with the current intensity gradually increasing, as depicted in the time interval between moments of time t2 and t3 in the third line of FIG. 3. Thus, this embodiment is concerned with a minimum closed-loop control which is relatively easy to implement and in which the minimum current $I_{Lmin}$ is adjusted via reference current source 15. It is also discernable from FIG. 3 that, in the case of excessive current in the inductive load 6, a longer period of time will be necessary until voltage $V_M$ has decreased to the value of Vref due to the then necessary higher measurement voltage $V_M$. In this longer period of time, the excessive current can then drop correspondingly down to the minimum current.

Figure 15:
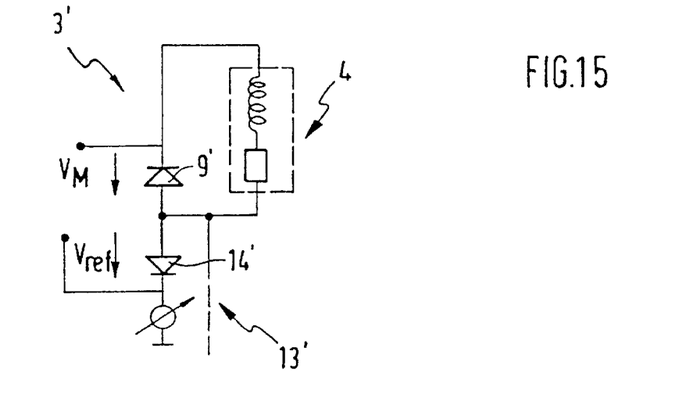
FIG. 15 is a circuit diagram illustrating an alternative embodiment.

In the embodiment of FIG. 1 described hereinbefore, there is provided an ohmic resistor 9 and, accordingly, an ohmic reference resistor 14. In particular if the measurement need not be so precise, it is possible to use instead of the ohmic measuring resistor another measurement transducer, in particular a component having a non-linear voltage/current characteristics. With such a component, the power dissipation in the second circuit branch can be reduced further. FIG. 15 shows an alternative embodiment with two modified circuit branches 3' and 13'. Second circuit branch 3' contains a diode 9' as measurement transducer, which delivers the measurement voltage $V_M$. The fourth circuit branch 13' contains a reference diode 14' delivering reference voltage Vref.

The provision of diodes with substantially identical characteristics is possible only with higher tolerances than in case of ohmic resistors. However, at the expense of a somewhat inferior accuracy in forming the measurement voltage and the reference voltage, reduced power dissipation is obtained. As a further modification, it is also possible to utilize the flyback diode itself for forming the measurement voltage, instead of measuring diode 9'.

Figure 4:
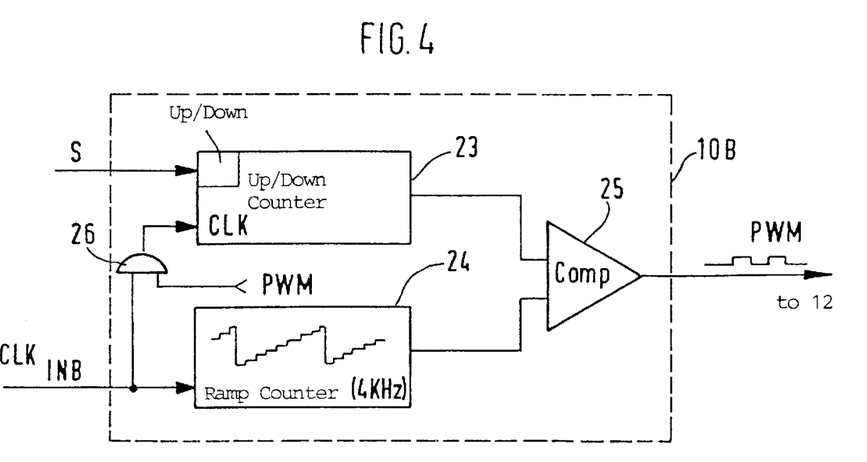
FIG. 4 is a block diagram of a second version of the first embodiment of the invention.

FIG. 4 illustrates a second version of the embodiment of the circuit arrangement according to the invention as shown in FIG. 1. In this second version of the first embodiment, PWM circuit 10B contains an up/down counter 23 having an up/down setting input, to which the sign signal S from comparator 20 is fed, a clock input and an output connected to an input of a digital comparator (Comp) 25, and contains furthermore a ramp counter 24 connected to a second input of digital comparator 25, as well as an AND gate 26.

The circuit components depicted in FIG. 4 are components known per se, the function of which is known to the expert. Input signal $CLK_{INB}$ is supplied to the clock input of the ramp counter so that the ramp counter counts up from zero to its maximum value relatively rapidly and in doing so generates a digital ramp signal at its output. Upon expiration of a period duration dependent on the clock frequency and the number of digits of the counter, the counter again starts up-counting from zero. Clock signal $CLK_{INB}$ is fed to the clock input of up/down counter 23 via AND gate 26. AND gate 26 is opened by the inverted PWM control signal.

The count of up/down counter 23 slowly changes in an up or down direction as a function of the change of the sign signal S. In the case of equality between the output signal of up/down counter 23 and the rapidly changing ramp signal at the output of ramp counter 24, switching over of the level at the output of digital comparator 25 takes place, thereby forming the PWM control signal for control terminal 12 of current switching element 14.

Figure 7:
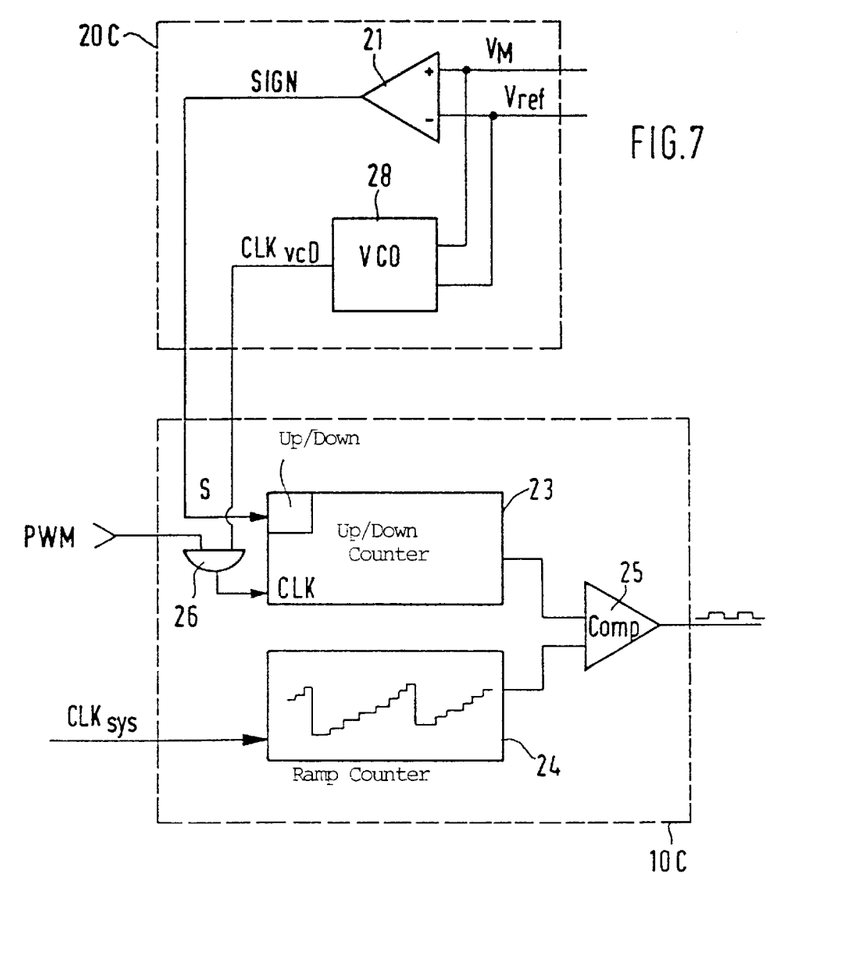
FIG. 7 is a block diagram of a second embodiment of the circuit arrangement according to the invention in a first version thereof.

FIG. 7 shows a block diagram of a first version of a second embodiment of a circuit arrangement according to the invention. The embodiment of FIG. 7 is similar to the embodiment of FIG. 4 with respect to the PWM circuit. PWM circuit 10C according to FIG. 7 is of similar structure and operates in a similar manner to PWM circuit 10B of FIG. 4, with the exception that the clock signals supplied to counters 23 and 24 are different, as will be elucidated in more detail hereinafter.

Ramp counter 24 of PWM circuit 10C according to FIG. 7 is fed with a system clock signal $CLK_{sys}$, which has a constant frequency of 4 kHz, for example. The operation of the ramp counter in so far is identical with the operation of ramp counter 24 in FIG. 4.

Up/down counter 23 of PWM circuit 10C, however, is not fed with a constant clock signal, i.e., a clock signal of constant frequency, but rather the clock input of up/down counter 23 is fed with a clock signal of variable frequency $CLK_{VCO}$. To this end, comparator 20C according to FIG. 7, in addition to OP amplifier 29 delivering sign signal S, contains moreover a voltage-controlled oscillator (VCO) 28 which receives as input voltage the differential voltage of measurement voltage $V_M$ and reference voltage Vref. In accordance with this differential voltage the oscillator 28 delivers an output oscillation signal or output pulse signal of variable frequency. In case of a great difference between $V_M$ and Vref, the frequency of output signal $CLK_{VCO}$ of VCO 28 is relatively high, so that accordingly—with AND gate 26 opened—up/down counter 23 counts relatively rapidly (either up or down, depending on sign signal S). Upon approximation of both voltages $V_M$ and Vref to each other, the frequency of clock signal $CLK_{VCO}$ at the output of VCO 28 decreases, so that up/down counter 23 counts correspondingly slower. This course of operation means that, with strong control deviation, the up/down counter counts very fast, i.e., provides for rapid approximation of the actual current value to the desired current value, whereas with low control deviation correspondingly slow adjustment control is carried out, whereby overshooting is avoided or kept low.

Figure 10:
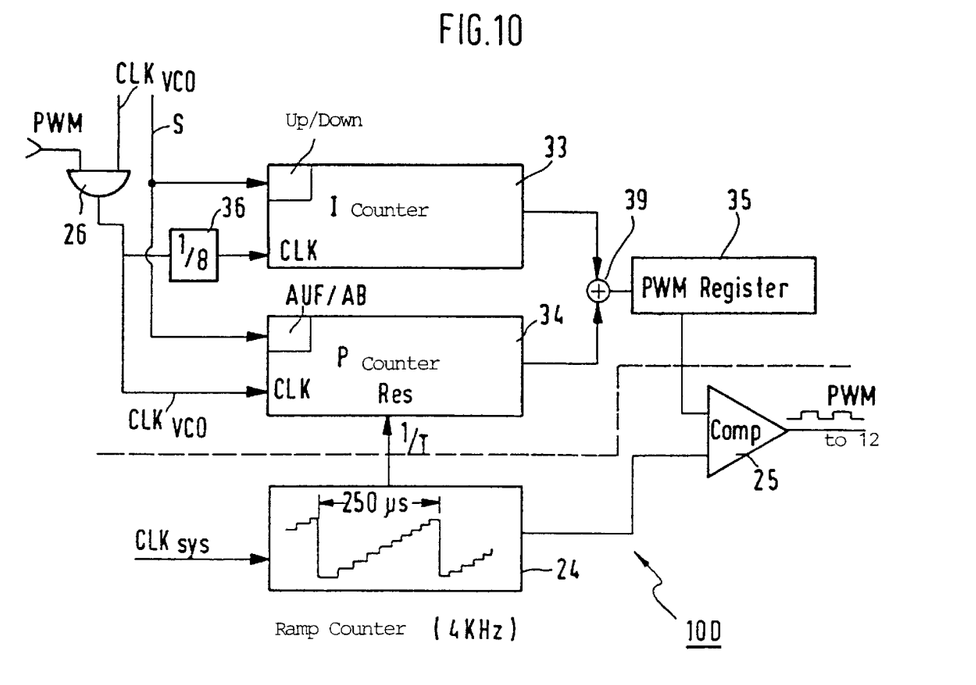
FIG. 10 is a block diagram of a second version of the second embodiment of the invention.

FIG. 10 shows a block diagram of a second version of the second embodiment of the invention. The input signals to the upper left in the circuit of FIG. 10 are the same as in the circuit of FIG. 7. The comparator delivering the signals S (sign signal) and $CLK_{VCO}$, respectively, is the same as comparator 20C illustrated in FIG. 7.

The difference between the circuit according to FIG. 10 and the circuit according to FIG. 7 consists in that up/down counter 23 of FIG. 7 is of multi-part design. Instead of one single up/down counter, PWM circuit 10D according to FIG. 10 contains a first up/down counter 33, referred to as I counter or integral counter, and a second up/down counter 34, referred to as P counter or proportional counter, with the outputs of these counters being connected to two inputs of an adder 39 and the clock inputs thereof being connected to the clock signal line in the manner gatherable from FIG. 10.

The clock input of P counter 34 is fed, via AND gate 26 already known from FIGS. 4 and 7, with the frequency-variable clock signal $CLK_{CVO}$ of the first, variable frequency. This clock signal $CLK_{VCO}$ of the first, variable frequency is passed to a frequency scaler 36 which divides the frequency of the clock signal by 8 and supplies the frequency-scaled clock signal to the clock input of I counter 33. The clock signal supplied to the clock input of the I counter thus has a third variable frequency that is lower than the first variable frequency of clock signal $CLK_{VCO}$ when the constant frequency of the clock signal $CLK_{sys}$, supplied to the clock input of ramp counter 24, is referred to as second frequency.

The operation of the PWM circuit 10D according to FIG. 10 is similar to that of the circuit according to FIG. 7, with the exception that the output signal of up/down counter 23 of FIG. 7 is replaced by the output signal of adder 39 adding the counts of I counter 33 and P counter 34 and feeding the sum to a PWM register 35. The contents thereof is compared by digital comparator 25 to the respective count of the ramp counter so as to form at the output the PWM control signal for control terminal 12 of current switch 11 in the manner already elucidated hereinbefore.

Figure 11:
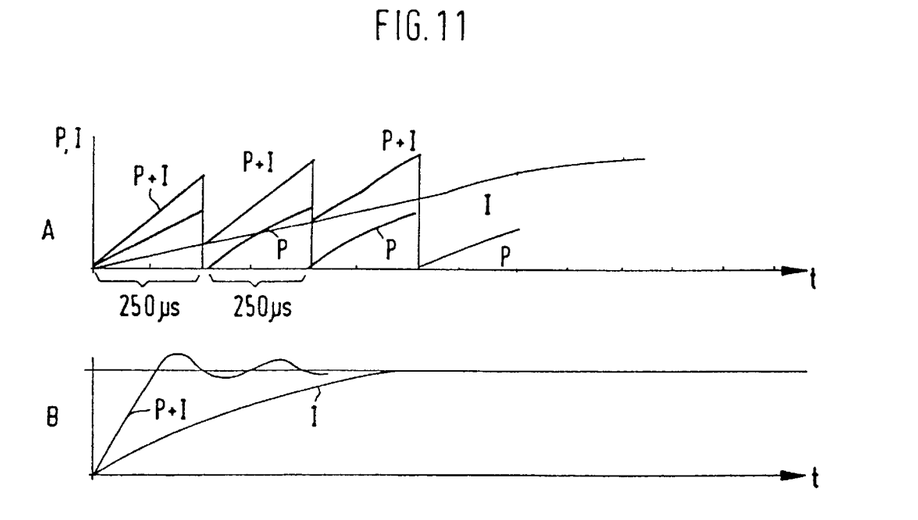
FIGS. 11A and 11B each show an illustrative representation elucidating the control behavior of the circuit of FIG. 10.

FIG. 11 schematically illustrates the operation of the circuit according to FIG. 10. The ramp counter performs up-counting with clock signal $CLK_{sys}$, of relatively high frequency and is reset at a period duration of 250 µs. This corresponds to a ramp signal frequency of 4 kHz. This frequency is used for resetting P counter 34 by means of ramp counter 24, with the ramp counter to this end delivering a resetting signal of the frequency 1/T (=4 kHZ) to resetting input RES of P counter 34. In the left-hand part of FIG. 11A, the first period is illustrated in accordance with the period duration of the ramp counter. The adder 39 adds the contents of I counter 33 and P counter 34, thereby providing the sum P+I. FIG. 11 depicts as an example not the steady state, but the initial state at increasing the current. Up-counting of the P counter takes place in accordance with the clock frequency of clock signal $CLK_{VCO}$, with the clock frequency in turn being dependent on the difference between measurement voltage $V_M$ and reference voltage Vref. As the difference between these two voltages becomes progressively smaller, P counter 34 thus performs counting in progressively slower manner so that the proportional portion P becomes lower from interval to interval.

In comparison therewith, I counter 37 in fact also counts with varying frequency, which however is eight times lower. In accordance with the curve I in FIG. 11A, the value of the I counter increases progressively, but gradually approaches a horizontal.

FIG. 11B shows the sum signal P+I as an analog signal. It is possible to perceive the favorable control behavior in accordance with the path of the curve P+I.

Figure 12:
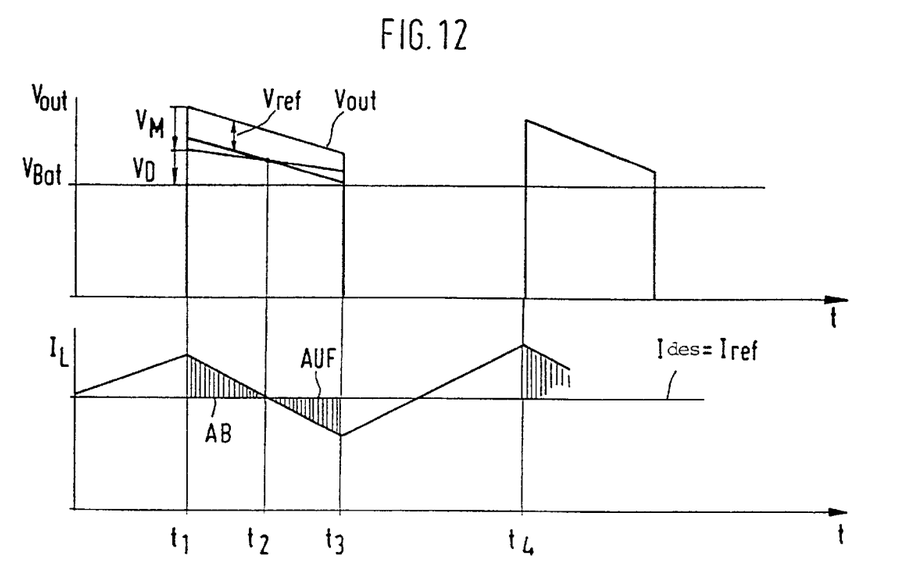
FIG. 12 is a pulse diagram illustrating the control behavior of the circuit arrangement according to FIG. 10.

For pointing out the difference of the embodiment according to FIG. 10 with respect to the embodiment according to FIG. 4, reference is made to FIG. 12. Voltage Vout changes suddenly as current switch 11 is opened and closed. The current $I_L$ to be regulated varies around the desired current which corresponds to reference current Iref. In the interval between the times t1 and t3, down-counting takes place in accordance with the output signal of adder 39, i.e., in accordance with the contents of PWM register 35. In the following interval between times t2 and t3, up-counting takes place. The change of the counting direction in I counter 33 and P counter 34 is dependent on the moment of time at which measurement voltage $V_M$ is equal to reference voltage Vref. The upper line in FIG. 12 shows in addition the forward voltage of the diode $V_D$.

Figure 14:
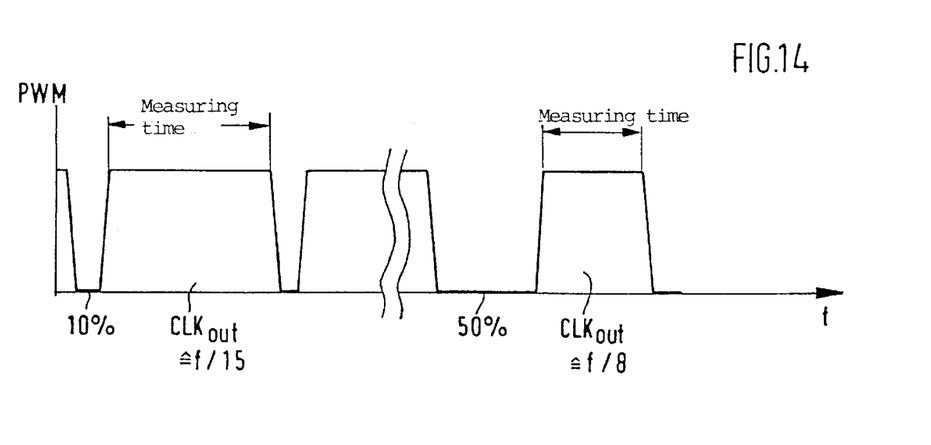
FIG. 14 is a pulse diagram elucidating the operation of the circuit according to FIG. 13.

In the PWM circuit elucidated hereinbefore, which make use of counters, measuring is carried out during the entire pulse interval. This situation is shown in FIG. 14. FIG. 14 shows the pulse intervals of PWM control signals as high levels and the pulses proper as low levels. If the respective pulse interval is long, the measuring time is correspondingly long, as shown in FIG. 14. In order to obtain comparable results by means of the counters within different measuring times, the embodiments of the invention provide for measuring time compensation. This measuring time compensation takes care that, in the case of a relatively long measuring time as shown to the left in FIG. 14, counting takes place with a relatively low clock frequency, whereas in case of a relatively short measuring time as shown to the right in FIG. 14, counting takes place with a relatively high clock frequency. The effect obtainable by corresponding selection of the clock signal is that always the same numbers of clock pulses are counted irrespective of the particular measuring time.

Figure 13:
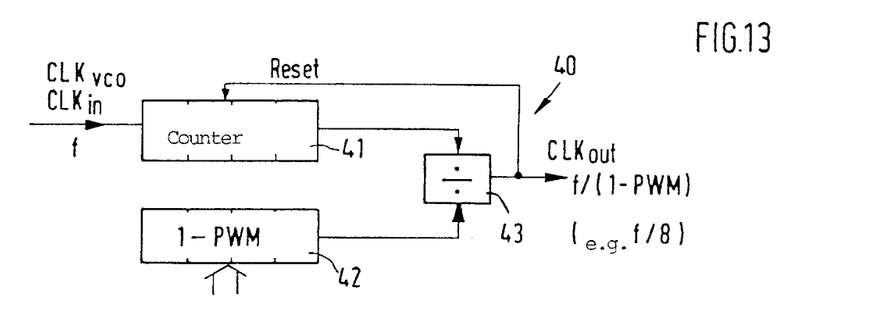
FIG. 13 is a block diagram of a measuring time compensation circuit of the second and fourth circuit branches of FIG. 1.

FIG. 13 shows a preferred embodiment of a measuring time compensation circuit 40. Circuit 40 contains a counter 41 having a clock input, a resetting input R and an output, a divisor register 42 in which a value corresponding to (1−PWM) is continuously stored anew, and a divider circuit 43 having two inputs and an output.

Counter 41 performs periodic up-counting with a constant input clock signal CLKin or a variable input clock signal $CLK_{VCO}$ in order to be reset by a resetting signal at the output of divider circuit 43. Divider circuit 43 receives the signal from the output of counter 41 at its dividend input and receives the contents of divisor register 42 at its divisor output and delivers a quotient signal as clock signal CLKout at its output. Clock signal CLKout has the frequency f/(1−PWM).

If, for example, the four-digit contents of divisor register 42 are loaded with the possible contents 1, 2 . . . 15, the frequency of input clock signal CLKin of counter 41 is divided accordingly by 1, 2 . . . or 15, respectively. The frequency of output signal CLKout is scaled down correspondingly. With low duty cycle and correspondingly short pulse duration of the PWM control signal, the measuring time is very long due to the then long pulse interval, as shown to the left in FIG. 14. In accordance with this measuring time of maximum length, division of the input frequency by 15 would take place, so that the frequency of output signal CLKout then would be f/15. With a measuring time of medium length, a division by eight would be carried out, so that output clock signal CLKout would have a frequency of f/8.

The measuring time compensation circuit described hereinbefore can also be employed for control circuits and closed-loop control circuits that are not designed specifically for inductive loads, but for controlling arbitrary loads with the aid of a PWM control signal and contain one or more counters, with a counting operation being carried out within a variable time interval in conjunction with a measuring operation.

The invention is not restricted to the above-described specific embodiments and the various versions thereof, but rather by the scope of the claims that follow and the equivalents thereof.

What is claimed is:

1. A circuit arrangement for controlling an inductive load, comprising:
   a first circuit branch coupled between a first terminal and a second terminal and including the inductive load to be controlled;
   a second circuit branch coupled between the first terminal and the second terminal and including a flyback diode;
   a third circuit branch coupled between a common node of the first and second circuit branches on the one hand and a third terminal on the other hand and including an electronic current switching element having a control terminal to which a PWM control signal is supplied;
   a fourth circuit branch connected to the second circuit branch and comprising a reference element and a reference current source in order to generate the desired current signal;
   a current sensor for sensing a current dependent on the current flowing through the inductive load, and for generating an actual current signal, the current sensor being arranged in the second circuit branch;
   a closed-loop control circuit receiving as a first input signal the actual current signal and as a second input signal a desired current signal in order to form thereof the PWM control signal;
   a comparator comparing the desired current signal to the actual current signal and generating a sign signal as a function of the comparison;
   an up/down counter having an up/down control input to which the sign signal is supplied, a clock input to which a clock signal of a first frequency is supplied, as well as a count output;
   a ramp counter having a clock input to which a clock signal of a second frequency is supplied, and a count output; and
   a digital comparator having a first input connected to the count output of the up/down counter, a second input connected to the count output of the ramp counter, and an output connected to the control terminal of the current switching element.

2. The circuit arrangement of claim 1,
wherein the current sensor is an ohmic measuring resistor connected in series with the flyback diode.

3. The circuit arrangement of claim 1,
comprising an RS flipflop having the sign signal supplied to the setting input thereof and having a clock signal, configured to define the frequency of the PWM control signal, applied to the resetting input thereof and having its output connected to the control terminal of the current switching element.

4. The circuit arrangement of claim 1,
wherein the first frequency is identical with the second frequency.

5. The circuit arrangement of claim 1,
comprising a voltage-controlled oscillator having two input terminals receiving the actual current signal and the desired current signal, respectively, and an output connected to the clock input of the up/down counter in order to supply thereto, as clock signal of the first frequency, the frequency-variable output signal of the voltage-controlled oscillator.

6. The circuit arrangement of claim 1,
wherein the clock input of the up/down counter has a gate connected upstream thereof that blocks the clock signal supplied to the clock input during the pulse times of the PWM control signal.

7. The circuit arrangement of claim 1,
wherein the up/down counter comprises:
a) a first up/down counter part referred to as I or integral counter;
b) a second up/down counter part referred to as P or proportional counter;
c) a PWM register having an input and an output; and
d) an adder having two inputs connected to the output of the I counter part and to the output of the P counter part, respectively, and an output connected to the input of the PWM register, e) the output of the PWM register being connected to one input of the digital comparator, the clock input of the P counter part being fed with the clock signal of the first frequency, the clock input of the I counter part being fed with a clock signal of a third frequency that is preferably lower than the first frequency, and the P counter part having a resetting input connected to the ramp counter and receiving from the same a resetting signal in each ramp period.

8. The circuit arrangement of claim 7, wherein the clock input of the I counter part has a frequency divider connected upstream thereof that receives the clock signal of the first frequency and converts the same to the clock signal of the third frequency.

9. The circuit arrangement of claim 1, comprising a measuring time compensation circuit that scales down the clock signal of the first frequency, supplied to the clock input of the up/down counter, in accordance with the duty cycle of the PWM control signal in such a manner that, with high duty cycle and consequently long measuring time, relatively strong scaling down is effected whereas with low duty cycle only relatively weak scaling down is effected.

10. The circuit arrangement of claim 9, wherein the measuring time compensation circuit comprises:

a) a resettable counter having an input receiving an input clock signal with an input frequency, and having a counter output and a resetting input;

b) a divisor register having an output and a setting input via which a digital value is adjustable that is in inverse ratio to the duty cycle of the PWM control signal, and c) a divider circuit having a dividend input connected to the output of the counter, a divisor input connected to the output of the divisor register, and an output passing the clock signal of the first frequency to the clock input of the up/down counter, with the first frequency corresponding to the quotient of the input frequency and the divisor.

11. A circuit for controlling an inductive load, comprising:

a current sensing circuit coupled to the inductive load and configured to sense a current dependent on the current flowing through the inductive load and to generate an actual current signal;

a control circuit coupled to the current sensing circuit and configured to compare the actual current signal with a reference signal and to generate a pulse-width modulated (PWM) control signal to a control switch coupled between a reference voltage terminal and a common node of the inductive load and the current sensing circuit, the control circuit comprising a comparator configured to receive as a first input the actual current signal and as a second input the reference signal and to generate a sign signal; and a PWM circuit configured to receive the sign signal and to generate the PWM control signal, the PWM circuit comprising:

an up/down counter having an up/down control input for receiving the sign signal, a clock input for receiving the clock signal of a first frequency, and a counter output;

a ramp counter having a clock input to receive a clock signal of a second frequency, and a ramp counter output; and a digital comparator having a first input connected to the counter output of the up/down counter, a second input connected to the ramp counter output of the ramp counter, and an output connected to the control terminal of the control switch.

12. The circuit of claim 11, further comprising a voltage-controlled oscillator having first and second input terminals for receiving the actual current signal and the reference signal, respectively, and an output connected to the up/down counter input for receiving the clock signal to supply the clock signal of the first frequency.

13. The circuit of claim 11, wherein the up/down counter comprises:

a first up/down counter configured as an integral counter;

a second up/down counter configured as a proportional counter;

a PWM register having an input and an output; and an adder having two inputs connected to the output of the first counter and to an output of the second counter, respectively, and an output connected to the input of the PWM register, and the output of the PWM register connected to one input of the digital comparator, and the second up/down counter having a clock input configured to receive the clock signal of the first frequency, and the first up/down counter having a clock input configured to receive a clock signal of a frequency that is preferably lower than the first frequency.

* * * * *